(12) United States Patent
Anderson et al.

(10) Patent No.: US 7,256,078 B2
(45) Date of Patent: Aug. 14, 2007

(54) HIGH MOBILITY PLANE FINFETS WITH EQUAL DRIVE STRENGTH

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/622,169

(22) Filed: Jan. 11, 2007

(65) Prior Publication Data

US 2007/0111410 A1 May 17, 2007

Related U.S. Application Data

(62) Division of application No. 10/905,616, filed on Jan. 13, 2005, now Pat. No. 7,196,380.

(51) Int. Cl.
*H01L 21/338* (2006.01)
(52) U.S. Cl. .............. 438/157; 438/176; 438/199; 257/E21.421; 257/E21.623
(58) Field of Classification Search ........... 438/149, 438/157, 176, 199, 276, 283
See application file for complete search history.

(56) References Cited

U.S. PATENT DOCUMENTS

| 6,413,802 | B1 | 7/2002 | Hu et al. |
| 6,630,388 | B2 | 10/2003 | Sekigawa et al. |
| 6,645,797 | B1 | 11/2003 | Buynoski et al. |
| 6,998,684 | B2 | 2/2006 | Anderson et al. |
| 2003/0067017 | A1 | 4/2003 | Leong et al. |
| 2003/0102518 | A1 | 6/2003 | Fried et al. |
| 2003/0193058 | A1 | 10/2003 | Fried et al. |
| 2003/0197194 | A1 | 10/2003 | Fried et al. |
| 2006/0057787 | A1* | 3/2006 | Doris et al. .......... 438/153 |
| 2006/0071275 | A1* | 4/2006 | Brask et al. .......... 257/350 |

* cited by examiner

*Primary Examiner*—Thanhha S. Pham
(74) *Attorney, Agent, or Firm*—Gibb & Rahman, LLC; William D. Sabo, Esq.

(57) ABSTRACT

An integrated circuit structure has a buried oxide (BOX) layer above a substrate, and a first-type fin-type field effect transistor (FinFET) and a second-type FinFET above the BOX layer. The second region of the BOX layer includes a seed opening to the substrate. The top of the first-type FinFET and the second-type FinFET are planar with each other. A first region of the BOX layer below the first FinFET fin is thicker above the substrate when compared to a second region of the BOX layer below the second FinFET fin. Also, the second FinFET fin is taller than the first FinFET fin. The height difference between the first fin and the second fin permits the first-type FinFET to have the same drive strength as the second-type FinFET.

20 Claims, 9 Drawing Sheets

HIGH MOBILITY PLANE FINFETS WITH EQUAL DRIVE STRENGTH

CROSS-REFERENCE TO RELATED APPLICATIONS

This Application is a division of U.S. patent application Ser. No. 10/905,616, filed Jan. 13, 2005 which is now U.S. Pat. No. 7,196,380, hereby incorporated by reference.

BACKGROUND OF THE INVENTION

1. Field of the Invention

The invention generally relates to an integrated circuit structure having a first-type (e.g., N-type) fin-type field effect transistor (FinFET) and a second-type (e.g., P-type) FinFET above a buried oxide (BOX) layer, where the second FinFET fin is taller than the first FinFET fin and where the height difference between the first fin and the second fin permits the first-type FinFET to have the same drive strength as the second-type FinFET.

2. Description of the Related Art

As transistor design is improved and evolves, the number of different types of transistors continues to increase. For example, one type of transistor that uses a fin-shaped channel region covered with a gate conductor, with the outer portions of the fin being used as source/drain regions is referred to as a fin-type field effect transistor (FinFET). One such FinFET is disclosed in U.S. Pat. No. 6,413,802 to Hu et al. (hereinafter "Hu"), disclosure of which is incorporated herein by reference.

Conventional FinFETs that utilize different types of transistors (e.g., N-type and P-type FinFETs) encounter problems because of the different drive strengths of the different types of transistors.

SUMMARY OF THE INVENTION

This disclosure presents, in one embodiment, a method of forming an integrated circuit structure having a first-type (e.g., N-type) fin-type field effect transistor (FinFET) and a second-type (e.g., P-type) FinFET above a buried oxide (BOX) layer. This method begins by forming the BOX layer on a first-type wafer and bonding the BOX layer to a second-type wafer to join the first-type wafer to the second-type wafer to form a structure having the first-type layer and the second-type layer separated by the BOX layer. The method removes a portion of the first-type layer to expose a portion of the BOX layer and then thins an exposed portion of the BOX layer. Next a seed opening is formed through the exposed portion of the BOX layer and the second-type material is grown from the second-type layer through the seed opening. Then, the invention patterns the first-type layer into a first fin and the second-type material into a second fin. After this gate, source, and drain regions for the first and second fin are formed to complete the first-type FinFET and the second-type FinFET.

A first region of the BOX layer below the first fin is thicker above the second-type layer when compared to a second region of the BOX layer below the second fin and the second fin is taller than the first fin. The second fin extends a greater distance above the second region of the BOX layer when compared to a distance the first fin extends above the first region of the BOX layer and the first fin and the second fin extend about the same height above the second-type layer. The height difference between the first fin and the second fin is approximately equal to the thickness difference between the first region of the BOX layer and the second region of the BOX layer. Also, the height difference between the first fin and the second fin compensates for the drive strength difference between the first-type FinFET and the second-type FinFET.

In another embodiment, the invention presents a method that removes a portion of the first-type layer and the BOX layer to expose the second-type layer. Then, second-type material is formed over the exposed portion of the second-type layer. This embodiment avoids utilizing the seed opening of the first embodiment.

Thus, the invention provides a resulting integrated circuit structure that has a buried oxide (BOX) layer above a substrate, and a first-type fin-type field effect transistor (FinFET) and a second-type FinFET above the BOX layer. In one embodiment, the second region of the BOX layer includes a seed opening to the substrate. The top of the first-type FinFET and the second-type FinFET are planar with each other. A first region of the BOX layer below the first FinFET fin is thicker above the substrate when compared to a second region of the BOX layer below the second FinFET fin. Also, the second FinFET fin is taller than the first FinFET fin. Again, the height difference between the first fin and the second fin permits the first-type FinFET to have the same drive strength as the second-type FinFET.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
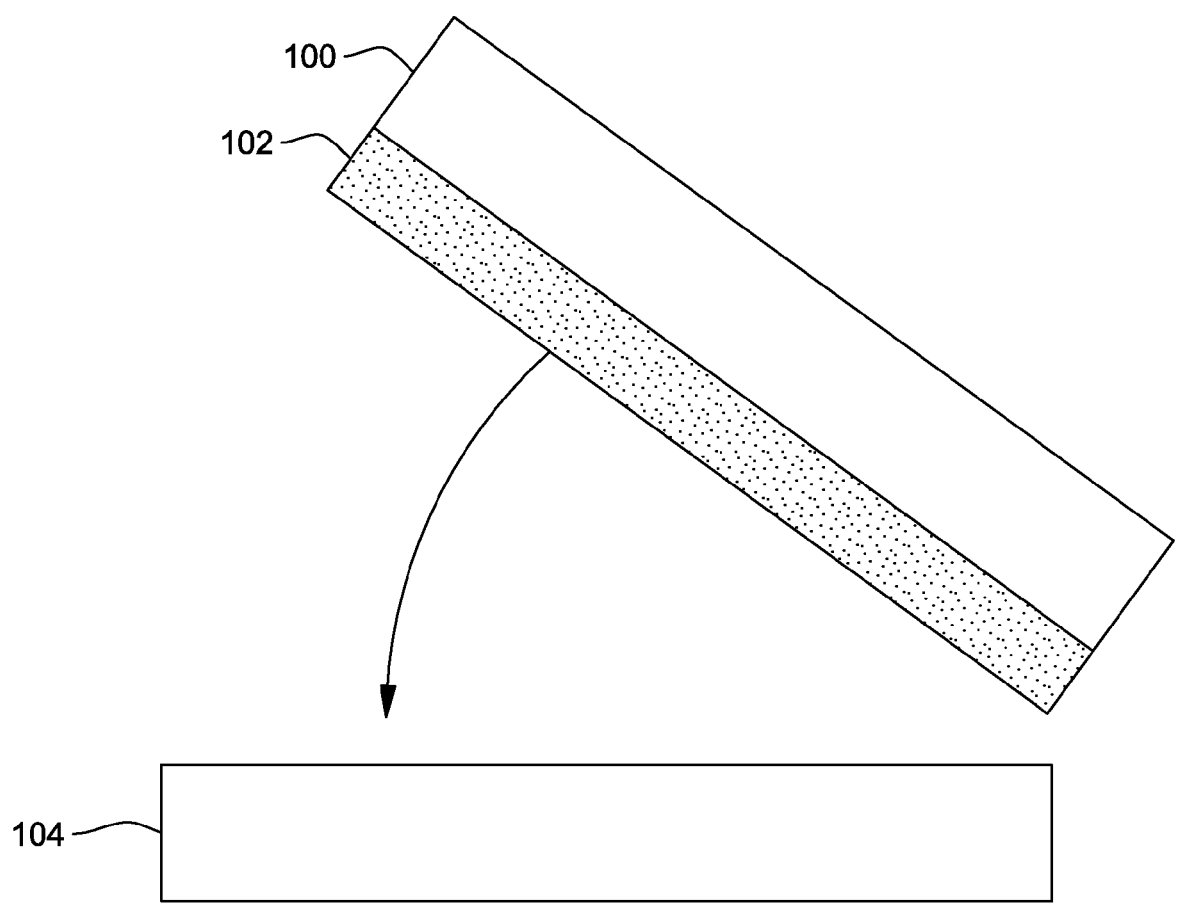
FIG. 1 is a schematic diagram of a partially completed integrated circuit structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 2:
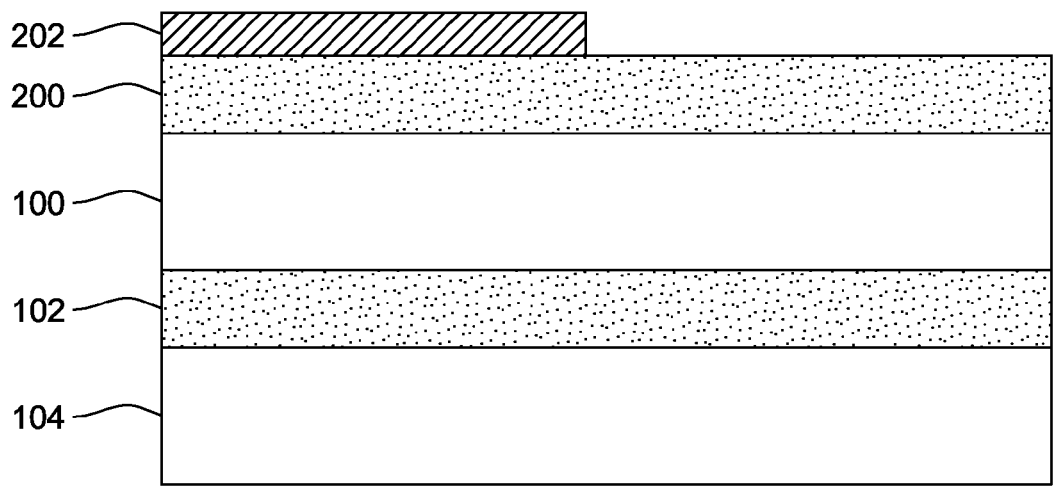
FIG. 2 is a schematic diagram of a partially completed integrated circuit structure according to the invention.

As shown in FIG. 1, a BOX layer 102 (such as $SiO_2$) is formed on a first-type wafer 100. The BOX layer 102 comprises the bonding agent (adhesive) that bonds the first-type wafer 100 to a second-type wafer 104. This forms the structure shown in FIG. 2 which has the first-type layer 100 and the second-type layer 104 separated by the BOX layer 102. An oxide 200 is grown on the first-type layer 100 and a mask 202 (such as a photoresist) is patterned on the oxide 200 using well-known mask formation and patterning techniques.

Figure 3:
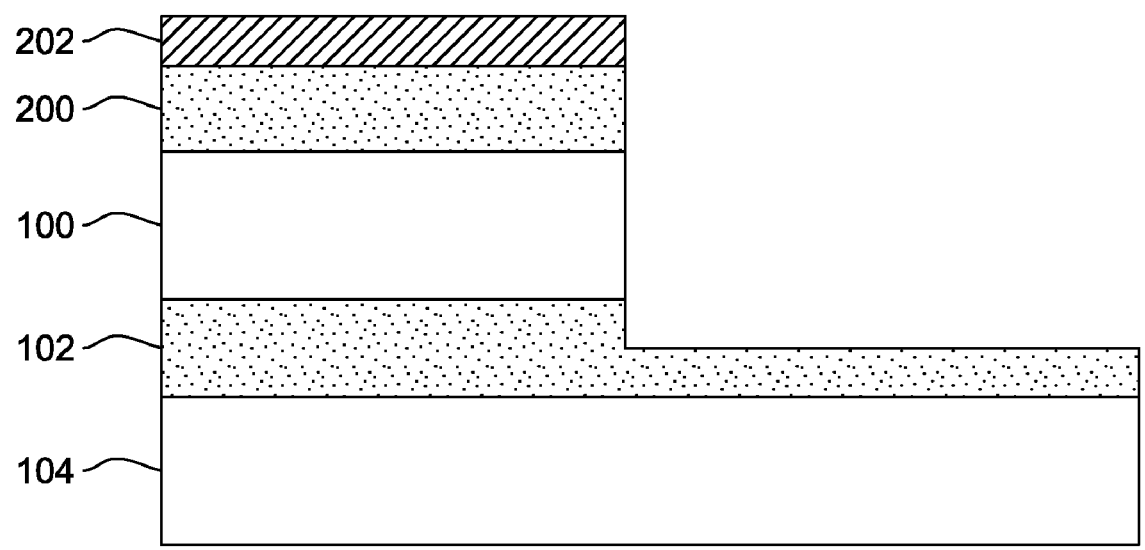
FIG. 3 is a schematic diagram of a partially completed integrated circuit structure according to the invention.
Figure 4:
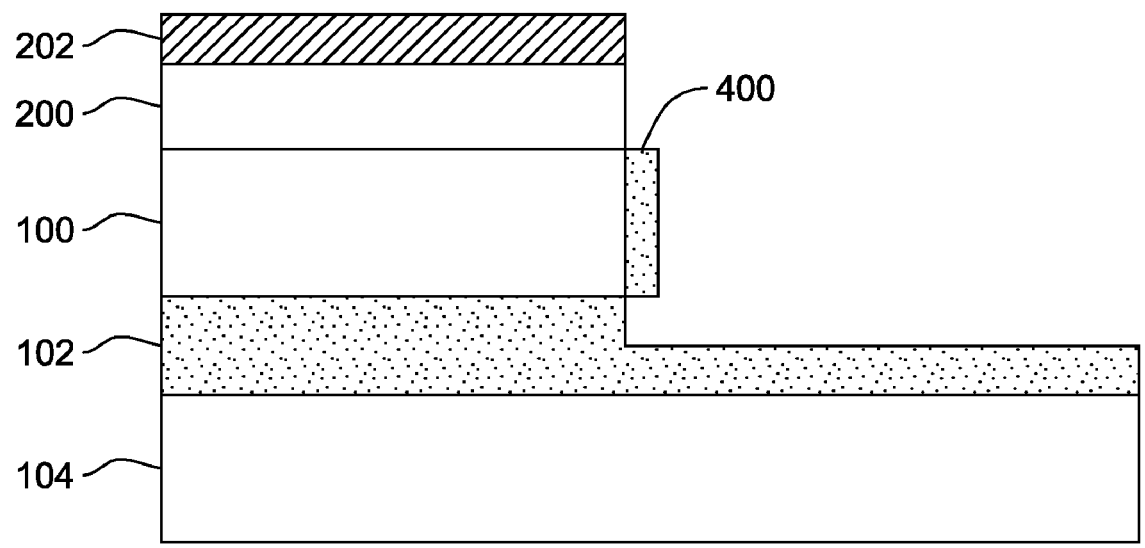
FIG. 4 is a schematic diagram of a partially completed integrated circuit structure according to the invention.

Then, as shown in FIG. 3, the exposed portions of the oxide 200 and first-type layer 100 are removed using, for example, one or more etching processes. Further, the etching process can be continued or another etching process can be utilized to thin the exposed portion of the BOX layer 102. In FIG. 4, the exposed sidewall of the first-type layer 100 is oxidized 400 to protect the first-type layer 100 during the subsequent processing.

Figure 5:
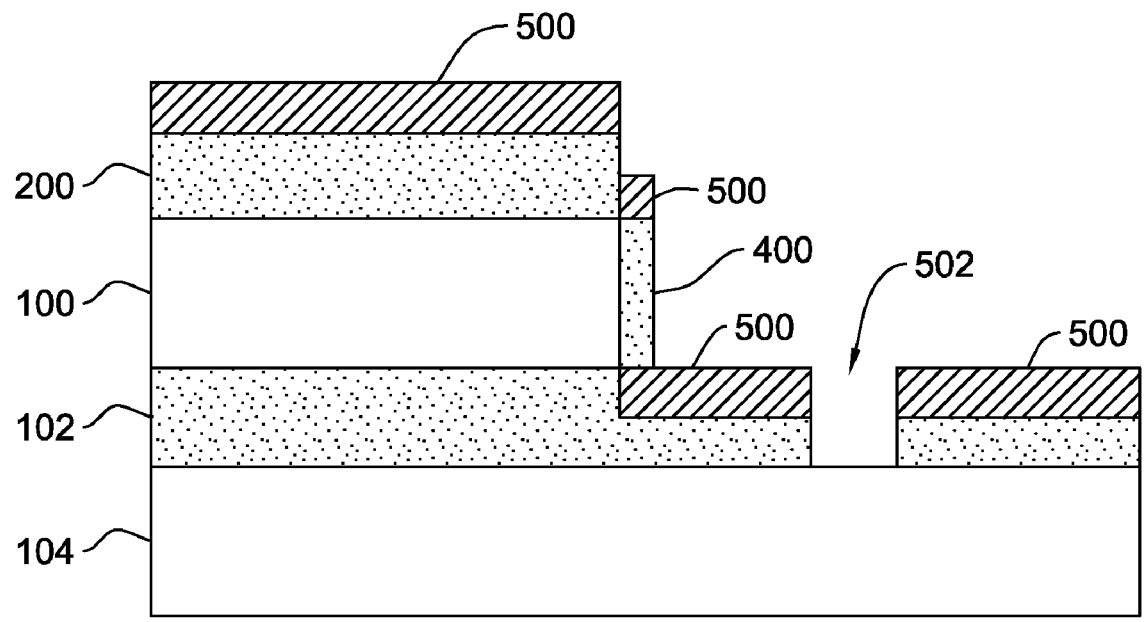
FIG. 5 is a schematic diagram of a partially completed integrated circuit structure according to the invention.
Figure 6:
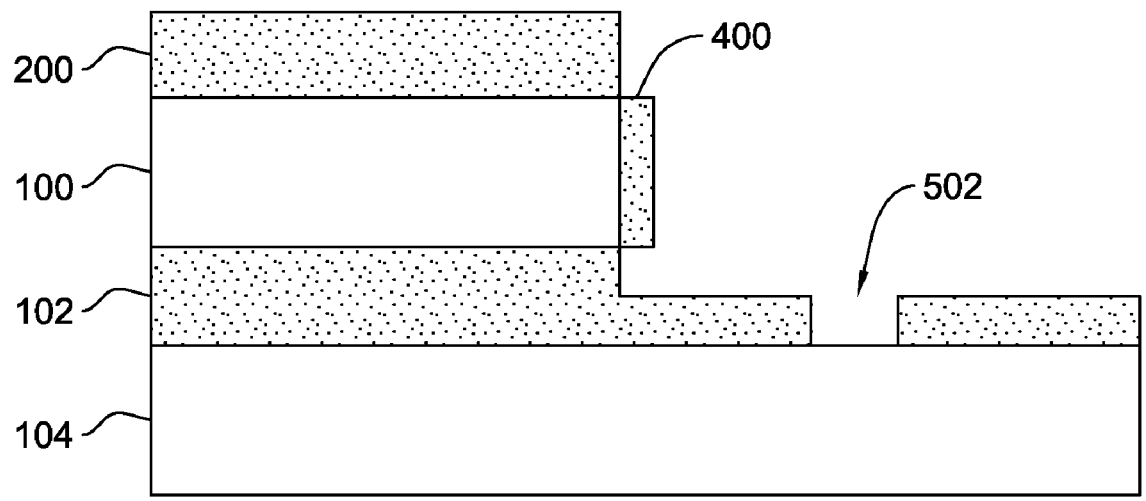
FIG. 6 is a schematic diagram of a partially completed integrated circuit structure according to the invention.
Figure 7:
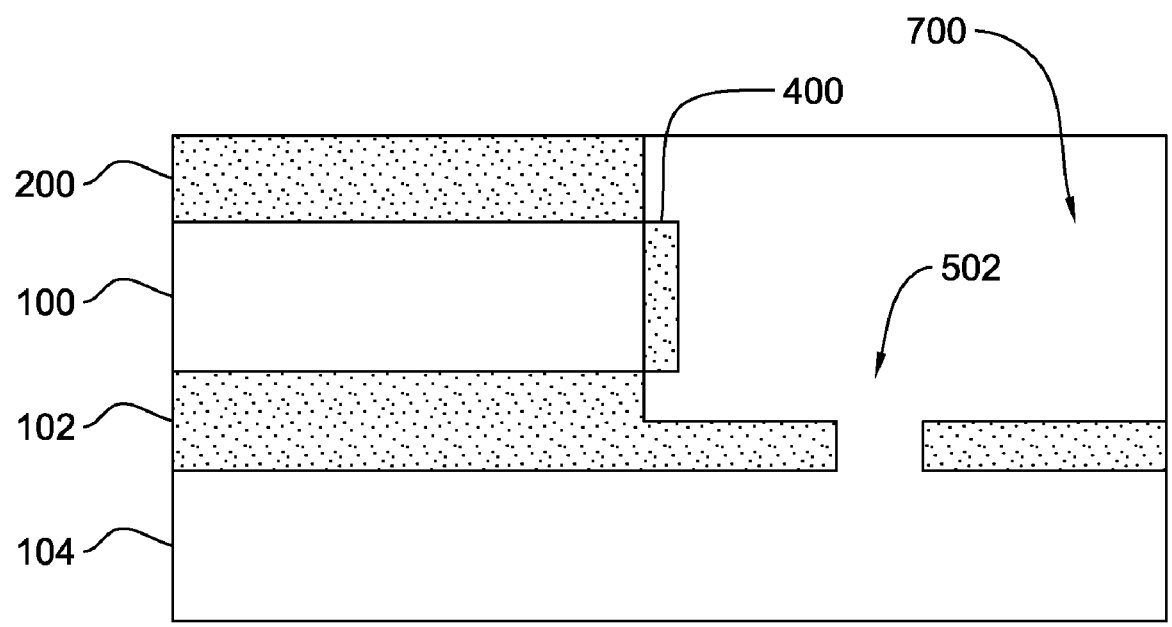
FIG. 7 is a schematic diagram of a partially completed integrated circuit structure according to the invention.
Figure 8:
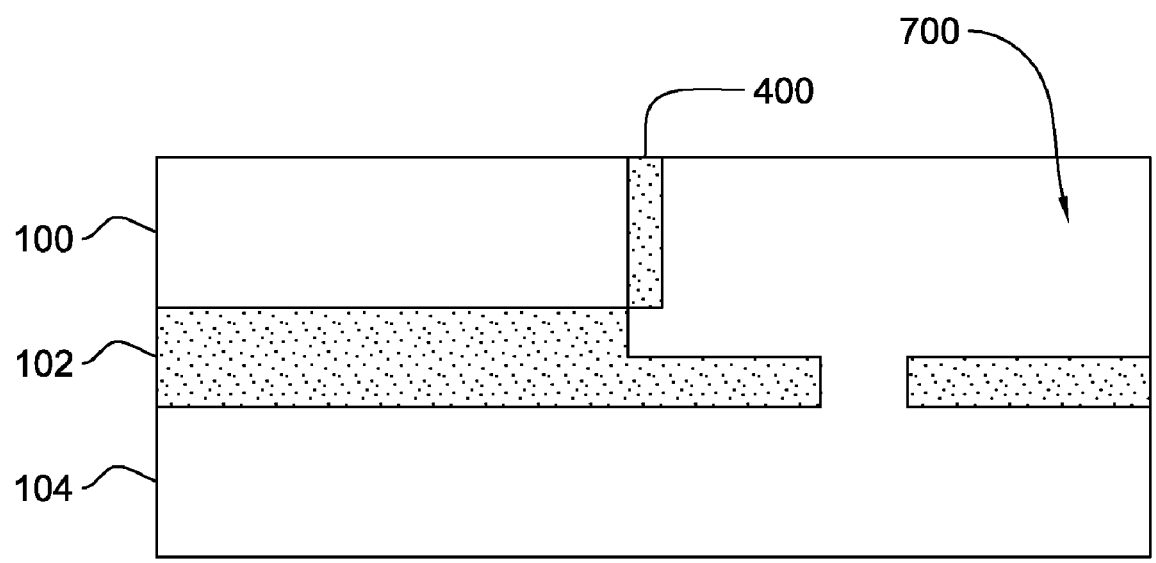
FIG. 8 is a schematic diagram of a partially completed integrated circuit structure according to the invention.

As shown in FIG. 5, the mask 202 is removed and another similar mask 500 is patterned over the BOX layer 102. An etching process is performed next, to form a seed opening 502 through the exposed portion of the BOX layer 102 to the second-type layer 104. As shown in FIG. 6, the mask 500 is then removed and, in FIG. 7, additional second-type material 700 is grown from the second-type layer 104 through the seed opening 502. Oxides 200, 400 protect the first-type material 100 during the growth of the second-type material 700. In FIG. 8, the structure is planarized, removing the oxide 200.

Figure 10:
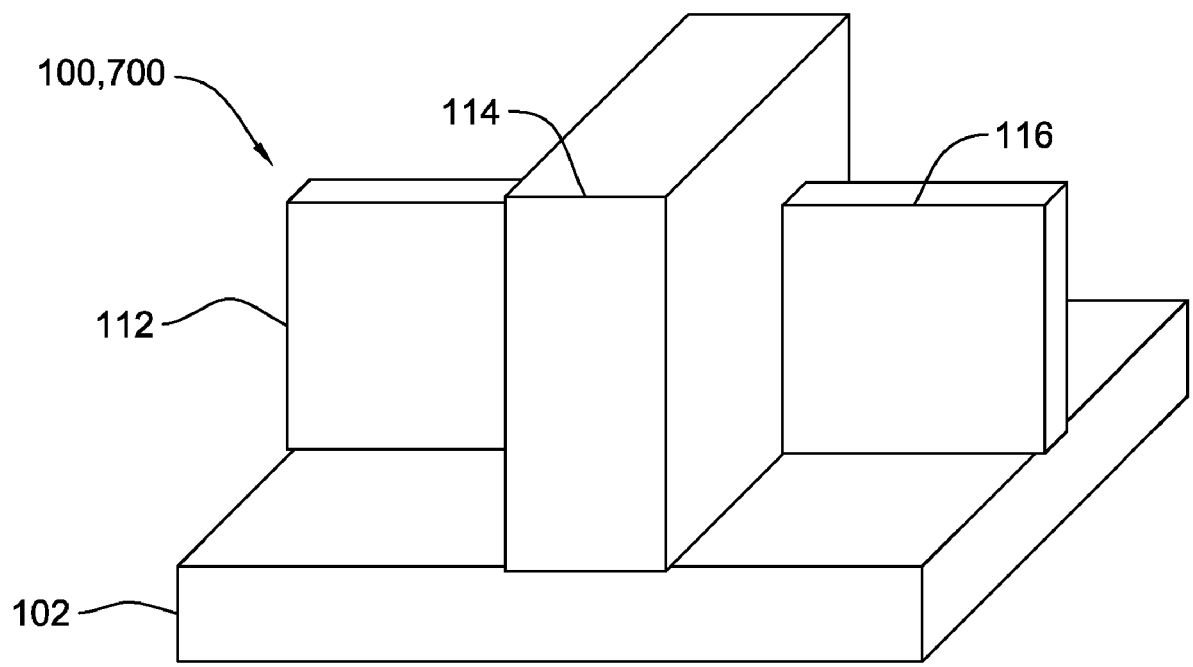
FIG. 10 is a perspective diagram of a FinFET structure according to the invention.

Then, the inventive methodology patterns a mask 900 (similar to the masks discussed above) over the first-type layer 100 and second-type material 700. Next, an etching process is used to pattern the first-type layer 100 the second-type material 700 into first and second fins. After this, conventional FinFET processing (such as that discussed in Hu) is performed to form a gate 114 around each fin 100, 700, as shown in FIG. 10. In addition, each fin 100, 700 is doped to create source 112 and drain regions 116 to complete the first-type FinFET and the second-type FinFET. While only one FinFET is illustrated in FIG. 10, both types of fins 100, 700 will undergo the processing shown in FIG. 10 to complete both the first and second types of FinFETs.

Figure 9:
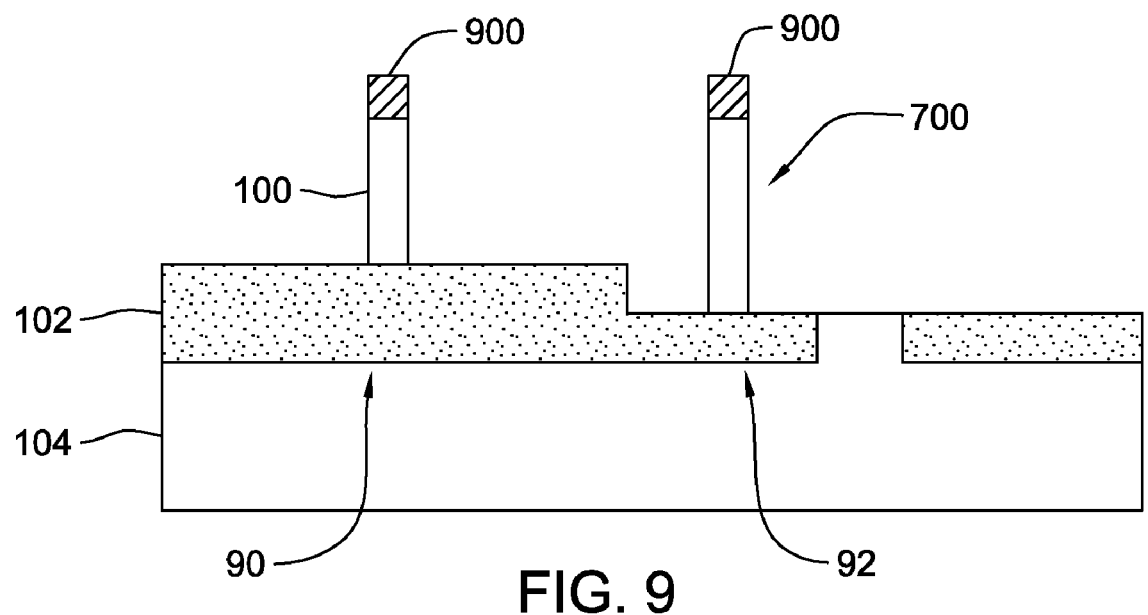
FIG. 9 is a schematic diagram of a partially completed integrated circuit structure according to the invention.

As shown in FIG. 9, with the inventive structure, one region 90 of the BOX layer 102 below the first fin 100 is thicker above the second-type layer 104 when compared to a second region 92 of the BOX layer 102 below the second fin 700. Also, the second fin 700 is taller than the first fin 100. In other words, the second fin 700 extends a greater distance above the second region 92 of the BOX layer 102 when compared to a distance the first fin 100 extends above the first region 90 of the BOX layer 102. Because of the planarization process shown in FIG. 8, the first fin 100 and the second fin 700 extend about the same height above the second-type layer 104. The height difference between the first fin 100 and the second fin 700 is approximately equal to the thickness difference between the first region 90 of the BOX layer 102 and the second region 92 of the BOX layer 102. Also, the height difference between the first fin 100 and the second fin 700 compensates for the drive strength difference between the first-type FinFET and the second-type FinFET.

Figure 11:
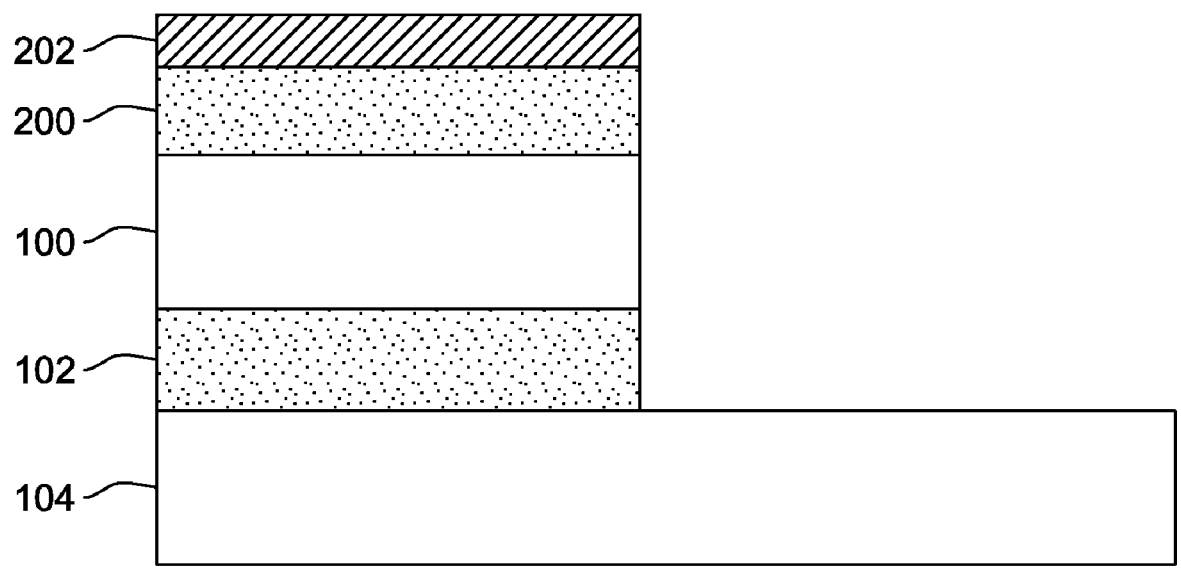
FIG. 11 is a schematic diagram of a partially completed integrated circuit structure according to the invention.
Figure 12:
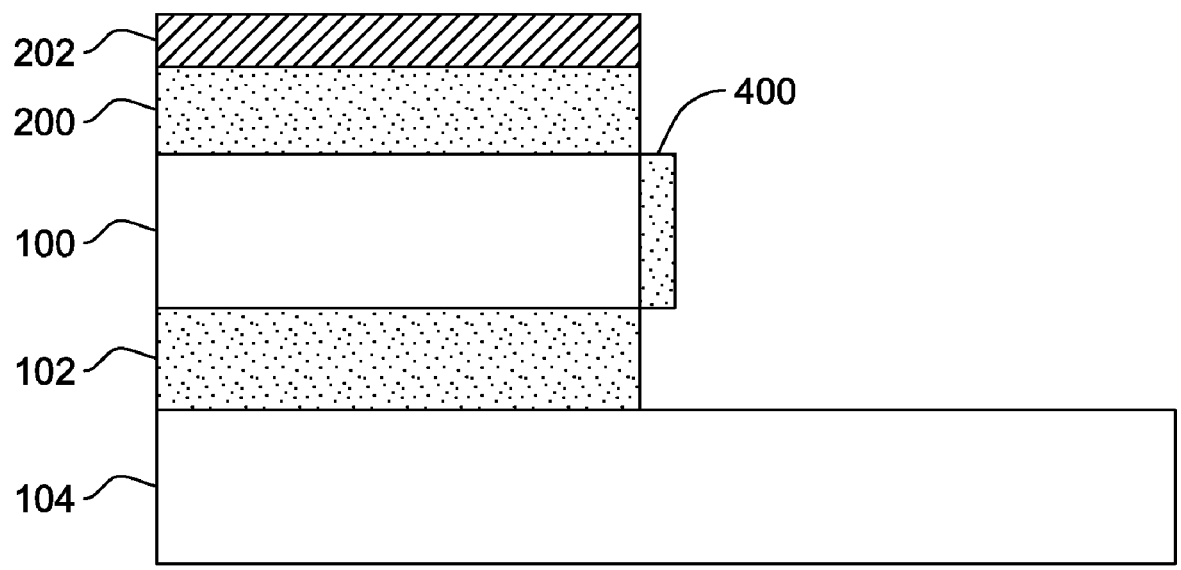
FIG. 12 is a schematic diagram of a partially completed integrated circuit structure according to the invention.
Figure 13:
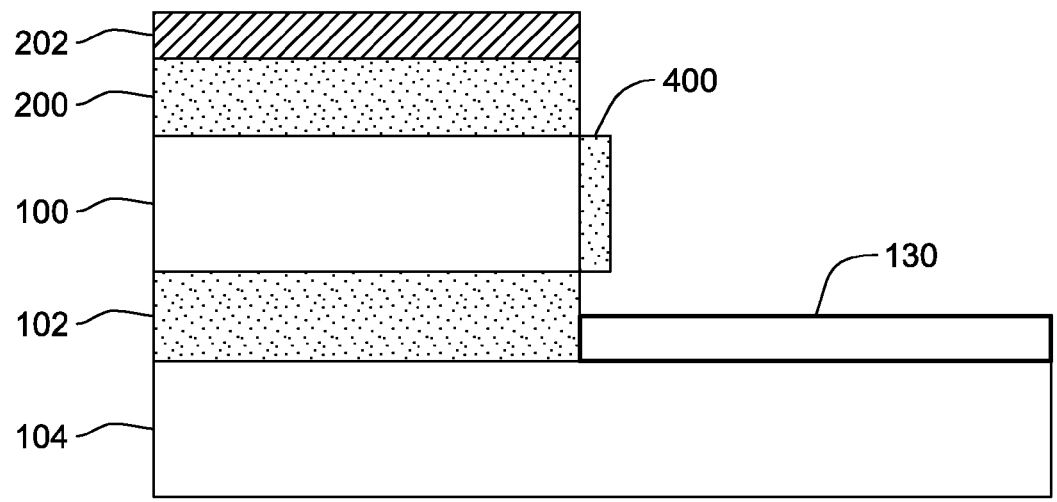
FIG. 13 is a schematic diagram of a partially completed integrated circuit structure according to the invention.

In another embodiment shown in FIGS. 11-16, the invention presents a method that removes a portion of the first-type layer 100 and the BOX layer 102 to expose the second-type layer 104, instead of just thinning the BOX layer 102, as shown in FIG. 11. The oxide 400 is formed and then a mask is used to selectively etch it away. This leaves part of the oxide 400 on layer 104, as shown in FIG. 12. A layer 130 is formed or grown on the exposed second-type layer 104, as shown in FIG. 13. The layer 130 can comprise any material that will oxidize at a higher rate than does the pure second-type material 104. For example, in one embodiment, the layer 130 can comprise silicon germanium if the second-type material 104 is silicon. This can be formed in an epitaxial growth process on the silicon second-type material 104 in the presence of germanium. As would be understood by those ordinarily skilled in the art, layer 130 could comprise other materials such as SiGe or as doped Si.

Figure 14:
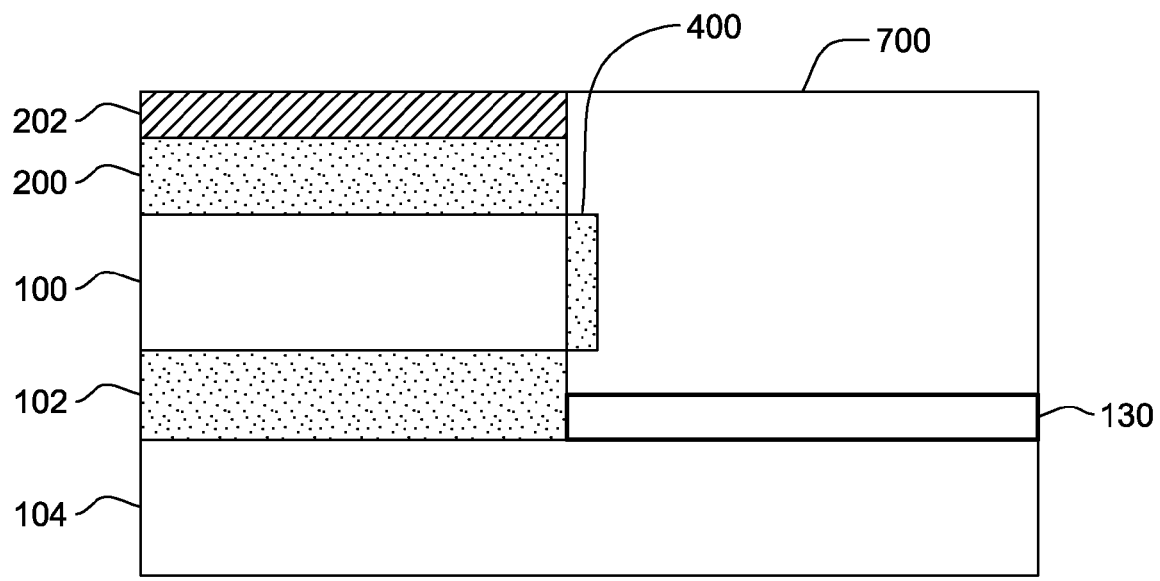
FIG. 14 is a schematic diagram of a partially completed integrated circuit structure according to the invention.
Figure 15:
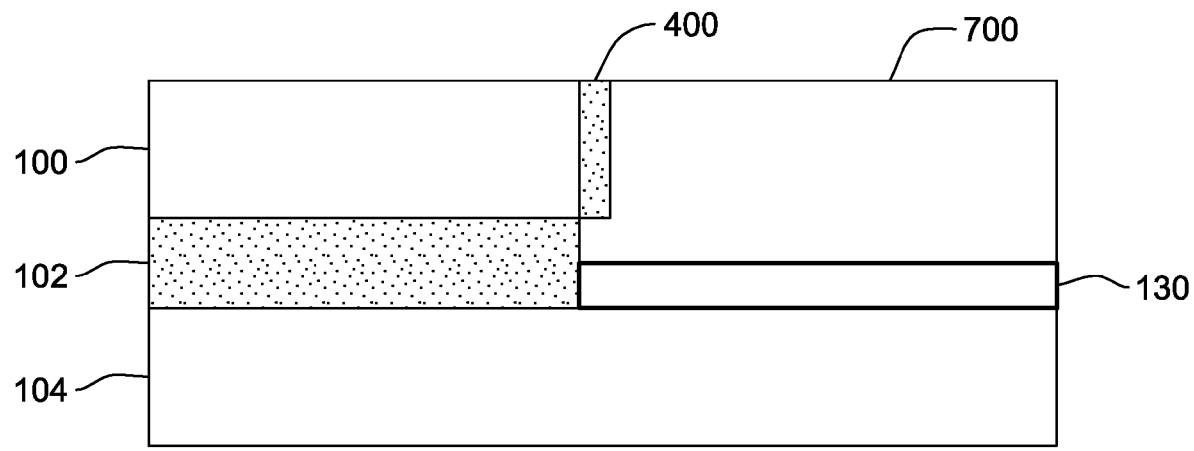
FIG. 15 is a schematic diagram of a partially completed integrated circuit structure according to the invention.
Figure 16:
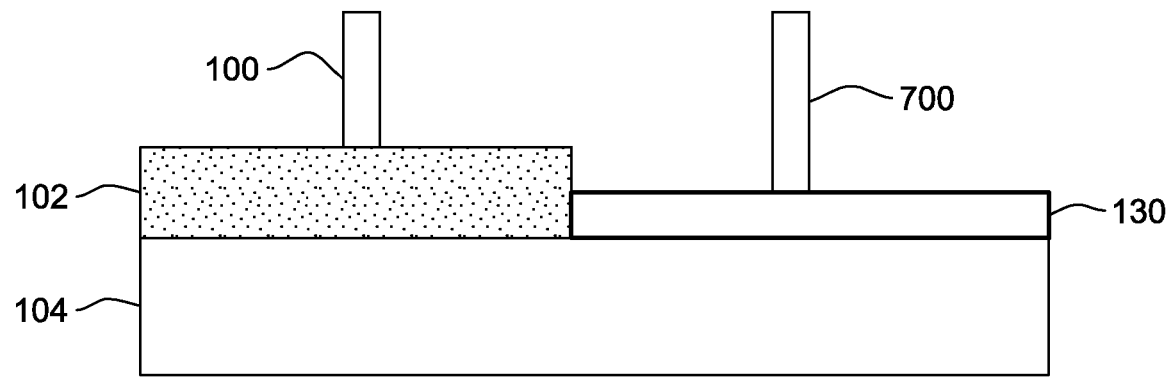
FIG. 16 is a schematic diagram of a partially completed integrated circuit structure according to the invention.

Then, as shown in FIG. 14, the second-type material 700 is formed over the exposed portion of the second-type layer 104. In FIG. 15, the structure is planarized and in FIG. 16, the fins 100, 700 are patterned using similar processing as discussed above for FIGS. 7 and 8. After the fins are formed, the layer 130 is oxidized (at a higher rate than the fin material 100, 700) to form an insulator at the bottom of fin 700 and insulate the fin 700 from the second-type layer 104. Processing similar to that shown in FIG. 10 is performed to complete the FinFETs. This embodiment avoids utilizing the seed opening 502 of the previous embodiment.

Figure 17:
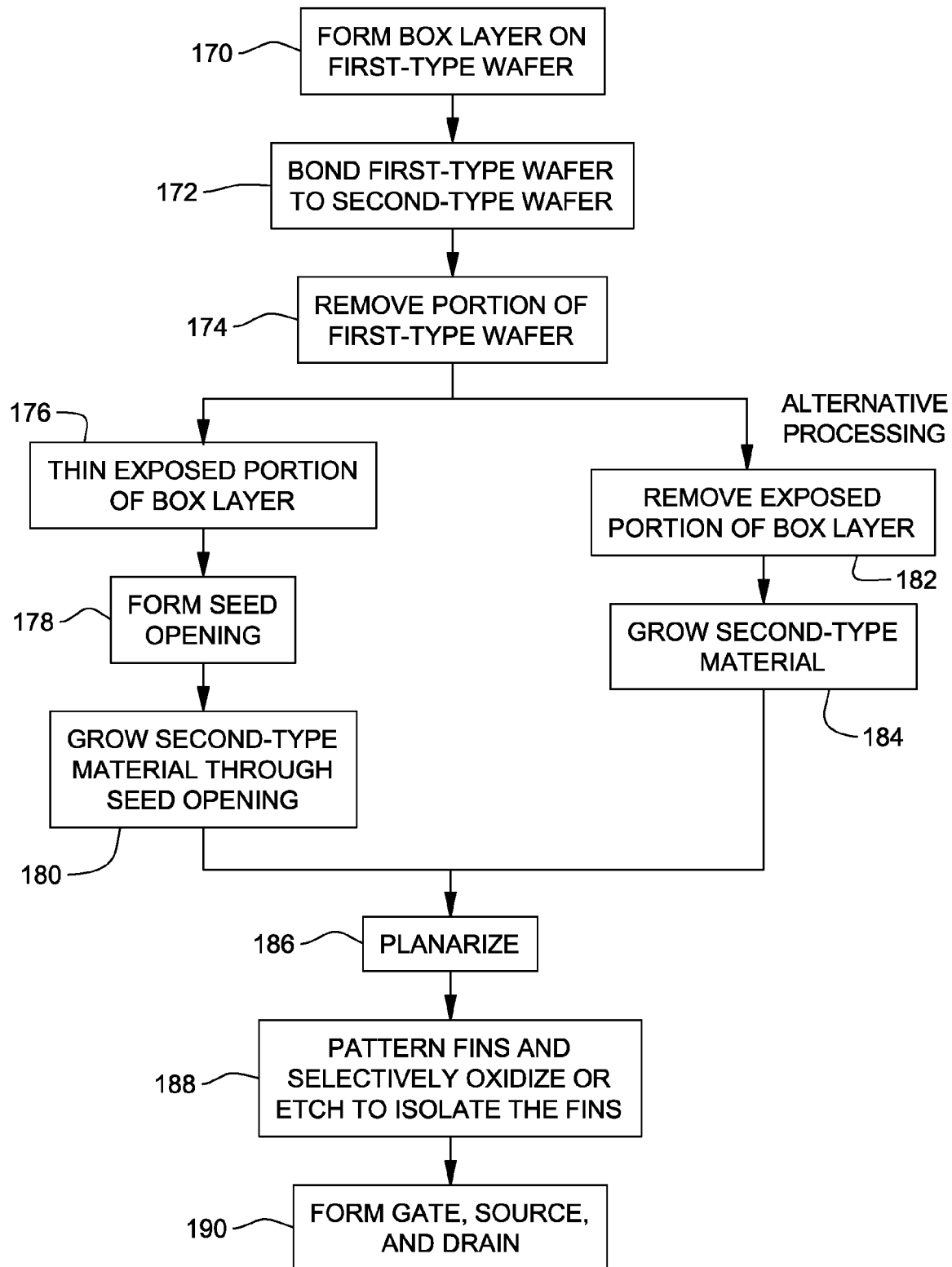
FIG. 17 is a flow diagram illustrating a preferred method of the invention.

FIG. 17 is a flowchart illustrating aspects of the inventive processing. In item 170, the BOX layer 102 is formed on a first-type wafer 100. In item 172, the BOX layer 102 is used to bond the first-type wafer 100 to the second-type wafer 104. In item 174, the invention removes a portion of the first-type layer 100 to expose a portion of the BOX layer and then, in item 176, the exposed portion of the BOX layer is thinned. Next a seed opening is formed through the exposed portion of the BOX layer (item 178) and the second-type material is grown from the second-type layer through the seed opening in item 180.

In an alternative processing embodiment, the exposed portion of the BOX layer 102 is removed (instead of just being thinned) as shown in item 182. Then, the second-type material 700 is grown on the second-type wafer 104 (or SiGe layer 130) as shown in item 184.

Then, the invention planarizes the structure 186 and patterns the fins and selectively oxidizes the bottom portion of the fins to isolate the fins from the substrate. After this, gate, source, and drain regions for the first and second fins are formed 190 to complete the first-type and second-type FinFETs.

Thus, the invention provides a resulting integrated circuit structure that has a buried oxide (BOX) layer 102 above a substrate, and a first-type fin-type field effect transistor (FinFET) and a second-type FinFET above the BOX layer 102. In one embodiment, the second region 92 of the BOX layer 102 includes a seed opening 502 to the second-type material substrate 104. The top of the first-type FinFET and the second-type FinFET are planar with each other. A first region 90 of the BOX layer 102 below the first FinFET fin 100 is thicker above the substrate 104 when compared to a second region 92 of the BOX layer 102 below the second fin FET fin 700. Also, the second FinFET fin 700 is taller than the first FinFET fin. The height difference between the first fin 100 and the second fin 700 permits the first-type FinFET to have the same drive strength as the second-type FinFET. Thus, the invention simultaneously produces equal drive strength fin-type NFETS and PFETs on the same chip/wafer. This is achieved by creating PFETs which are taller than the NFETs while keeping the top surface of the FINFETs planar (which is important to etch/gate definition/and spacer definition).

By more closely matching the drive strengths of the NFET and PFET, the overall circuit performance can be improved and area efficiency is also improved due to not having to add extra fins to get matched drive strength. Alternative methods add process complexity and can complicate the fin etch.

While the invention has been described in terms of preferred embodiments, those skilled in the art will recognize that the invention can be practiced with modification within the spirit and scope of the appended claims.

What is claimed is:

1. A method of forming an integrated circuit structure having a first-type fin-type field effect transistor (FinFET) and a second-type FinFET above a buried oxide (BOX) layer, said method comprising:
   providing a structure having a first-type layer and a second-type layer separated by said BOX layer,
   removing a portion of said first-type layer to expose a portion of said BOX layer;
   thinning an exposed portion of said BOX layer;
   forming a seed opening through said exposed portion of said BOX layer;
   growing a second-type material from said second-type layer through said seed opening;
   patterning said first-type layer into a first fin and said second-type material into a second fin;
   forming gate, source, and drain regions for said first fin to create said first-type FinFET; and
   forming gate, source, and drain regions for said second fin to create said second-type FinFET,
   wherein a first region of said BOX layer below said first fin is thicker above said second-type layer when compared to a second region of said BOX layer below said second fin, and
   wherein said second fin is taller than said first fin.

2. The method in claim 1, further comprising:
   forming said BOX layer on a first-type wafer; and
   bonding said BOX layer to a second-type wafer to join said first-type wafer to said second-type wafer to form said structure having said first-type layer and said second-type layer separated by said BOX layer.

3. The method in claim 1, wherein said second fin extends a greater distance above said second region of said BOX layer when compared to a distance said first fin extends above said first region of said BOX layer.

4. The method in claim 1, wherein said first fin and said second fin extend about the same height above said second-type layer.

5. The method in claim 1, wherein a height difference between said first fin and said second fin is approximately equal to a thickness difference between said first region of said BOX layer and said second region of said BOX layer.

6. The method in claim 1, wherein said first-type FinFET comprises an N-type FinFET and said second-type FinFET comprises a P-type FinFET.

7. The method in claim 1, wherein a height difference between said first fin and said second fin compensates for a drive strength difference between said first-type FinFET and said second-type FinFET.

8. A method of forming an integrated circuit structure having a first-type fin-type field effect transistor (FinFET) and a second-type FinFET above a buried oxide (BOX) layer, said method comprising:
   providing a structure having a first-type layer and a second-type layer separated by said BOX layer,
   removing a portion of said first-type layer to expose a portion of said BOX layer;
   removing an exposed portion of said BOX layer to expose said second-type layer;
   forming a second-type material over an exposed portion of said second-type layer;
   patterning said first-type layer into a first fin and said second-type material into a second fin;
   forming gate, source, and drain regions for said first fin to create said first-type FinFET; and
   forming gate, source, and drain regions for said second fin to create said second-type FinFET,
   wherein a first region of said BOX layer below said first fin is thicker above said second-type layer when compared to a second region of said BOX layer below said second fin, and
   wherein said second fin is taller than said first fin.

9. The method in claim 8, further comprising:
   forming said BOX layer on a first-type wafer; and
   bonding said BOX layer to a second-type wafer to join said first-type wafer to said second-type wafer to form said structure having said first-type layer and said second-type layer separated by said BOX layer.

10. The method in claim 8, wherein said second fin extends a greater distance above said second region of said BOX layer when compared to a distance said first fin extends above said first region of said BOX layer.

11. The method in claim 8, wherein said first fin and said second fin extend about the same height above said second-type layer.

12. The method in claim 8, wherein a height difference between said first fin and said second fin is approximately equal to a thickness difference between said first region of said BOX layer and said second region of said BOX layer.

13. The method in claim 8, wherein said first-type FinFET comprises an N-type FinFET and said second-type FinFET comprises a P-type FinFET.

14. The method in claim 8, wherein a height difference between said first fin and said second fin compensates for a drive strength difference between said first-type FinFET and said second-type FinFET.

15. A method of forming an integrated circuit structure having a first-type fin-type field effect transistor (FinFET)

and a second-type FinFET above a buried oxide (BOX) layer, said method comprising:

providing a structure having a first-type layer and a second-type layer separated by said BOX layer, removing a portion of said first-type layer to expose a portion of said BOX layer;

thinning an exposed portion of said BOX layer;

forming a seed opening through said exposed portion of said BOX layer;

growing a second-type material from said second-type layer through said seed opening;

patterning said first-type layer into a first fin and said second-type material into a second fin;

forming gate, source, and drain regions for said first fin to create said first-type FinFET; and forming gate, source, and drain regions for said second fin to create said second-type FinFET, wherein a first region of said BOX layer below said first fin is thicker above said second-type layer when compared to a second region of said BOX layer below said second fin, wherein said second fin is taller than said first fin, and wherein a height difference between said first fin and said second fin is approximately equal to a thickness difference between said first region of said BOX layer and said second region of said BOX layer.

16. The method in claim 15, further comprising:

forming said BOX layer on a first-type wafer; and bonding said BOX layer to a second-type wafer to join said first-type wafer to said second-type wafer to form said structure having said first-type layer and said second-type layer separated by said BOX layer.

17. The method in claim 15, wherein said second fin extends a greater distance above said second region of said BOX layer when compared to a distance said first fin extends above said first region of said BOX layer.

18. The method in claim 15, wherein said first fin and said second fin extend about the same height above said second-type layer.

19. The method in claim 15, wherein said first-type FinFET comprises an N-type FinFET and said second-type FinFET comprises a P-type FinFET.

20. The method in claim 15, wherein a height difference between said first fin and said second fin compensates for a drive strength difference between said first-type FinFET and said second-type FinFET.

* * * * *